(12) United States Patent
Lin et al.

(10) Patent No.: US 10,566,432 B2
(45) Date of Patent: Feb. 18, 2020

(54) TRANSISTOR DEVICE

(71) Applicant: NANYA TECHNOLOGY CORPORATION, New Taipei (TW)

(72) Inventors: Shih-Ting Lin, New Taipei (TW); Jhen-Yu Tsai, Kaohsiung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/229,486

(22) Filed: Dec. 21, 2018

(65) Prior Publication Data

US 2019/0172919 A1 Jun. 6, 2019

Related U.S. Application Data

(62) Division of application No. 15/861,050, filed on Jan. 3, 2018, now Pat. No. 10,325,991.

(60) Provisional application No. 62/595,199, filed on Dec. 6, 2017.

(51) Int. Cl.
| | | |
|---|---|---|
| *H01L 29/423* | (2006.01) | |
| *H01L 29/786* | (2006.01) | |
| *H01L 21/28* | (2006.01) | |
| *H01L 27/12* | (2006.01) | |

(52) U.S. Cl.
CPC .... *H01L 29/4232* (2013.01); *H01L 21/28008* (2013.01); *H01L 21/28114* (2013.01); *H01L 29/42384* (2013.01); *H01L 29/78609* (2013.01); *H01L 29/78615* (2013.01); *H01L 29/78618* (2013.01); *H01L 27/1203* (2013.01)

(58) Field of Classification Search
CPC ...................... H01L 29/4232; H01L 21/28008
See application file for complete search history.

(56) References Cited

U.S. PATENT DOCUMENTS

| | | | |
|---|---|---|---|
| 4,979,014 A | 12/1990 | Hieda et al. | |
| 6,316,808 B1 | 11/2001 | Smith, III | |
| 7,394,120 B2 * | 7/2008 | Yamasaki | H01L 29/4238 257/288 |
| 2014/0231895 A1 * | 8/2014 | Rothleitner | H01L 29/4238 257/315 |

FOREIGN PATENT DOCUMENTS

| | | |
|---|---|---|
| CN | 1670927 A | 9/2005 |
| TW | I645590 B | 12/2018 |

\* cited by examiner

*Primary Examiner* — Farun Lu
(74) *Attorney, Agent, or Firm* — Muncy, Geissler, Olds & Lowe, P.C.

(57) ABSTRACT

A transistor device includes an active region surrounded by an isolation structure, a gate structure disposed over the active region and the isolation structure, and a source/drain disposed in the active region. The gate structure includes a body portion extending in a first direction, a head portion extending in a second direction, and a pair of wing portions disposed at two opposite sides of the body portion. The first direction and the second direction are perpendicular to each other. Each of the wing portions is in contact with the head portion and the body portion.

15 Claims, 6 Drawing Sheets

TRANSISTOR DEVICE

PRIORITY CLAIM AND CROSS-REFERENCE

This application is a divisional application of U.S. patent application Ser. No. 15/861,050, filed on Jan. 3, 2018, which claims the benefit of U.S. Provisional Patent Application. No. 62/595,199, filed on Dec. 6, 2017. The entireties of the above-mentioned patent applications are hereby incorporated by reference herein and made a part of this specification.

TECHNICAL FIELD

The present disclosure relates to a transistor device, and more particularly, to a transistor device with lower power consumption.

DISCUSSION OF THE BACKGROUND

As semiconductor fabrication technology continues to improve, sizes of electronic devices are reduced, and the size and channel length of the conventional planar channel transistor also decrease correspondingly. Although the conventional planar channel transistor has been widely used in integrated circuit design, the ongoing reduction of the size and the channel length of the conventional planar channel transistor creates increasing problems with interaction between the source/drain and the carrier channel under the gate. For example, a boundary between an isolation structure and an active region results in a concentrated electric field. The concentrated electric field leads to leakage, which adversely affects the performance of the transistor by increasing power consumption, which is undesirable for many semiconductor circuit applications. Therefore, there is a need to reduce leakage current and thus to improve the performance of the transistor.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a transistor device. The transistor device includes an active region surrounded by an isolation structure, a gate structure disposed over the active region and the isolation structure, and a source/drain disposed in the active region. The gate structure includes a body portion extending in a first direction, a head portion extending in a second direction, and a pair of wing portions disposed at two opposite sides of the body portion. The first direction and the second direction are perpendicular to each other. Each of the wing portions is in contact with the head portion and the body portion.

In some embodiments, the head portion includes a first side, the body portion includes a second side, and each of the wing portions includes a third side. Both of the first side of the head portion and the second side of the body portion extend in the first direction. In some embodiments, the third side of each wing portion is in contact with the first side of the head portion and the second side of the body portion.

In some embodiments, the second side of the body portion and the third side of the wing portion form an included angle. In some embodiments, the included angle is an obtuse angle. In some embodiments, the included angle is between 130° and 165°.

In some embodiments, a portion of the head portion over the active region and the wing portion of the gate structure include a first length, and a portion of the body portion over the active region includes a second length. In some embodiments, a ratio of the first length to the second length is between 1:3 and 1:12.

In some embodiments, a portion of the head portion of the gate structure overlaps a portion of the isolation structure. In some embodiments, a portion of the body portion of the gate structure overlaps a portion of the isolation structure.

In some embodiments, the third sides of the wing portions and the second side of the body portion are in contact with an edge of the source/drain.

In some embodiments, a width of the head portion is greater than a width of the body portion.

Another aspect of the present disclosure provides a transistor device. The transistor device includes an active region surrounded by an isolation structure, a gate structure disposed over the active region and the isolation structure, and a source/drain disposed in the active region. The gate structure includes a body portion extending in a first direction, a first head portion and a second head portion extending in a second direction, a pair of first wing portions disposed at two opposite sides of the body portion, and a pair of second wing portions disposed at two opposite sides of the body portion. The first direction and the second direction are perpendicular to each other. The first head portion and the second head portion are disposed at two opposite ends of the body portion. Each of the first wing portions is in contact with the first head portion and the body portion. Each of the second wing portions is in contact with the second head portion and the body portion.

In some embodiments, the first head portion includes a first side, the body portion includes a second side, and the second head portion includes a third side. In some embodiments, the first side of the first head portion, the second side of the body portion and the third side of the second head portion all extend in the first direction.

In some embodiments, each of the first wing portions includes a fourth side in contact with the first side of the first head portion and the second side of the body portion. In some embodiments, each of the second wing portions includes a fifth side in contact with the third side of the second head portion and the second side of the body portion.

In some embodiments, the second side of the body portion and the fourth side of the first wing portion form a first included angle, and the second side of the body portion and the fifth side of the second wing portion form a second included angle. In some embodiments, the first included angle and the second included angle are obtuse angles.

In some embodiments, the first included angle is between 130° and 165°. In some embodiments, the second included angle is between 130° and 165°.

In some embodiments, a portion of the first head portion over the active region and the first wing portion include a first length, the body portion includes a second length, and a portion of the second head portion region and the second wing portion include a third length.

In some embodiments, a ratio of the first length, the second length and the third length is between 1:3:1 and 1:12:1.

In some embodiments, a portion of the first head portion overlaps a portion of the isolation structure. In some embodiments, a portion of the second head portion overlaps a portion of the isolation structure.

In some embodiments, the first wing portions are spaced apart from the second wing portions.

In some embodiments, the second side of the body portion, the fourth sides of the first wing portions and the fifth sides of the second wing portions are in contact with an edge of the source/drain.

In some embodiments, a width of the first head portion is greater than a width of the body portion. In some embodiments, a width of the second head portion is greater than a width of the body portion.

In the present disclosure, a transistor device is provided. In some embodiments, the transistor device includes a T-gate structure with the wing portions contacting both of the head portion and the body portion. In some embodiments, the transistor device includes an H-gate structure with the first and second wing portions contacting the first and second head portions and the body portion. Further, the wing portions and the body portion form an obtuse angle. Consequently, rounded edges are formed due to the obtuse angle formed by the body portion and the wing portions, and thus an electric field crowding issue is mitigated by the rounded edges. As a result, leakage current and power consumption are both reduced. Further, since the gate structure includes the wing portions which include a slanted side with respect to the source/drain, driving current is increased, and thus performance of the transistor device is improved.

In contrast, with a comparative transistor device or semiconductor layout structure including a T-gate structure or an H-gate structure, electric fields are always concentrated or crowded at a right angle between the body portion and the head portion, and thus leakage current cannot be reduced. The comparative transistor device therefore suffers from higher power consumption.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1A:
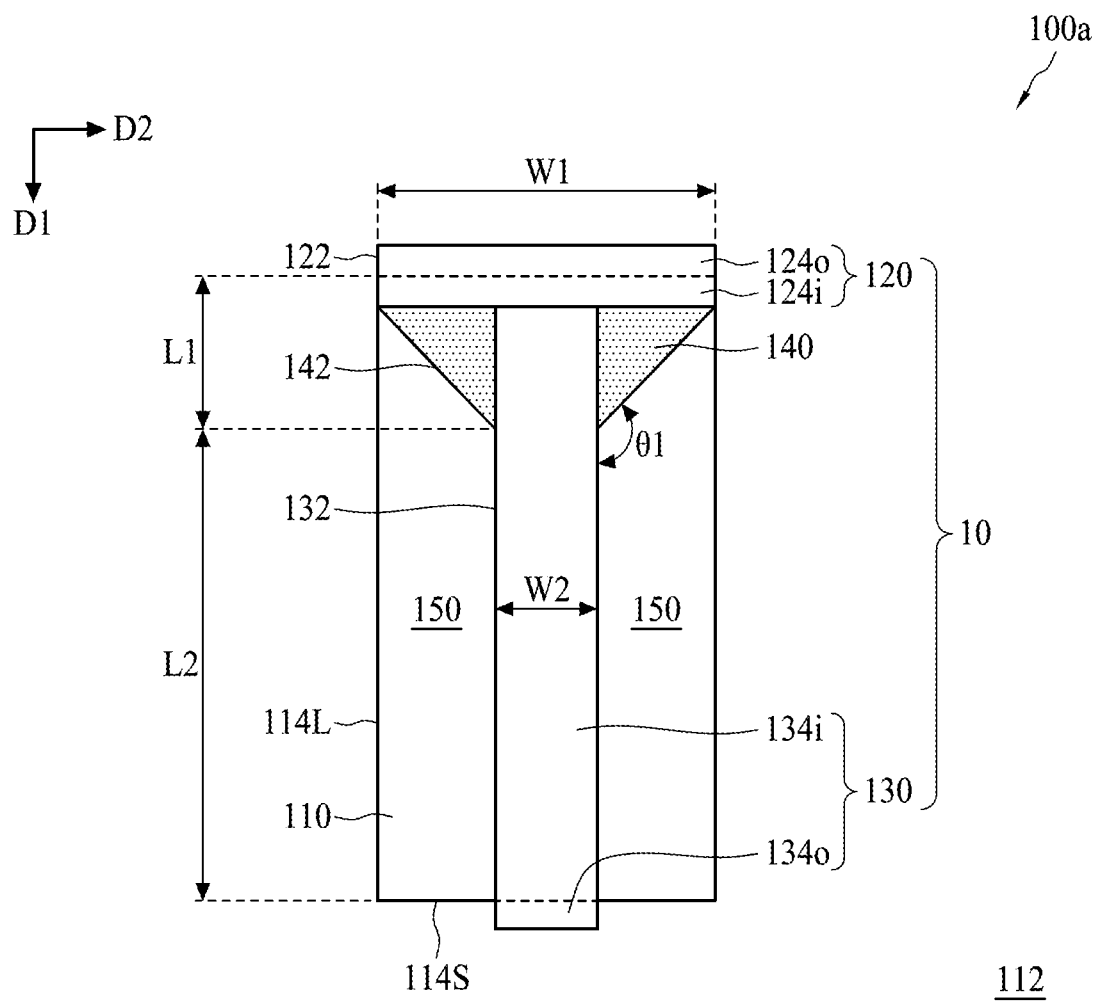
FIG. 1A is a schematic drawing illustrating a transistor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

As used herein, the term "n-type doped" refers to the addition of electron-increasing dopants/impurities including, for example but not limited to, V or VI group atoms into a material matrix in order to manipulate the carrier numbers.

As used herein, the term "p-type doped" refers to the addition of hole-increasing dopants/impurities including, for example but not limited to, II or III group atoms into a material matrix in order to manipulate the carrier numbers.

Figure 1B:
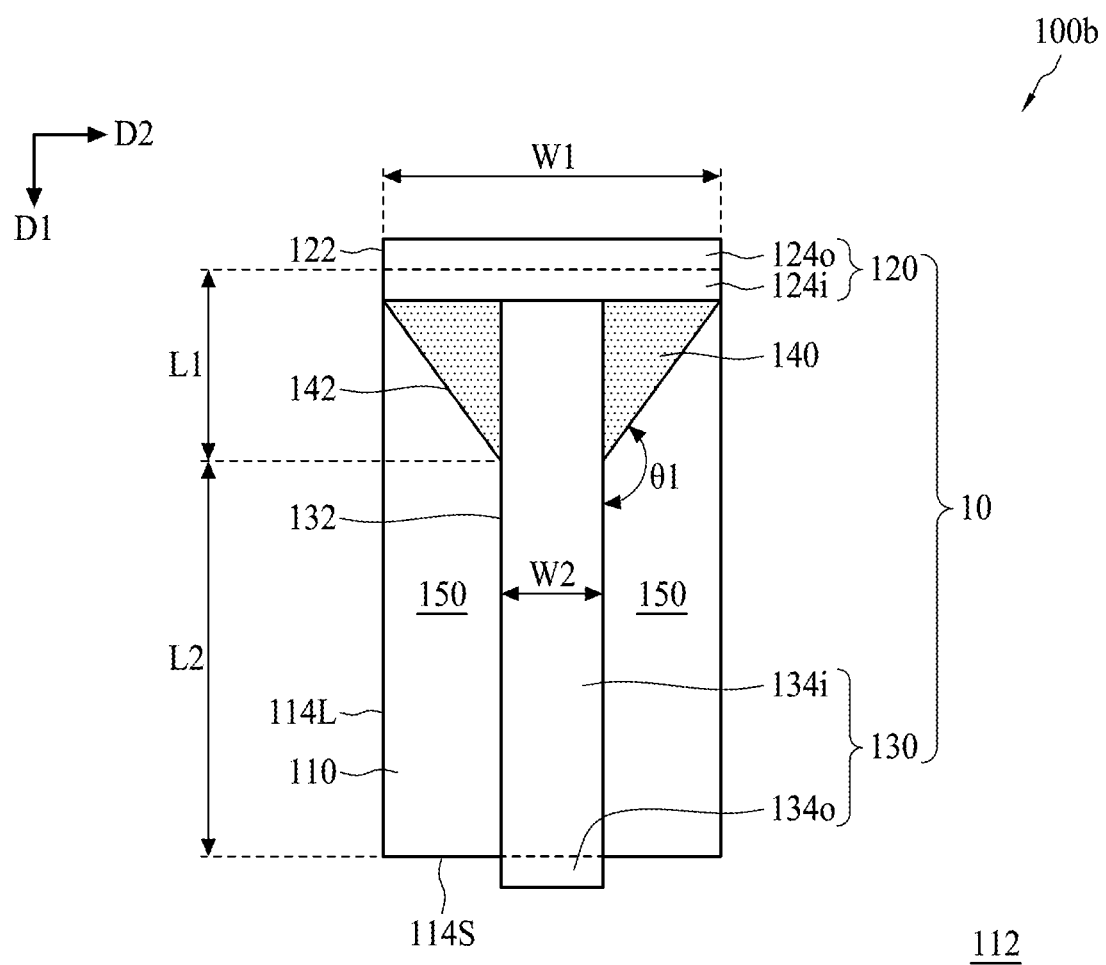
FIG. 1B is a schematic drawing illustrating a transistor device in accordance with some embodiments of the present disclosure.
Figure 1C:
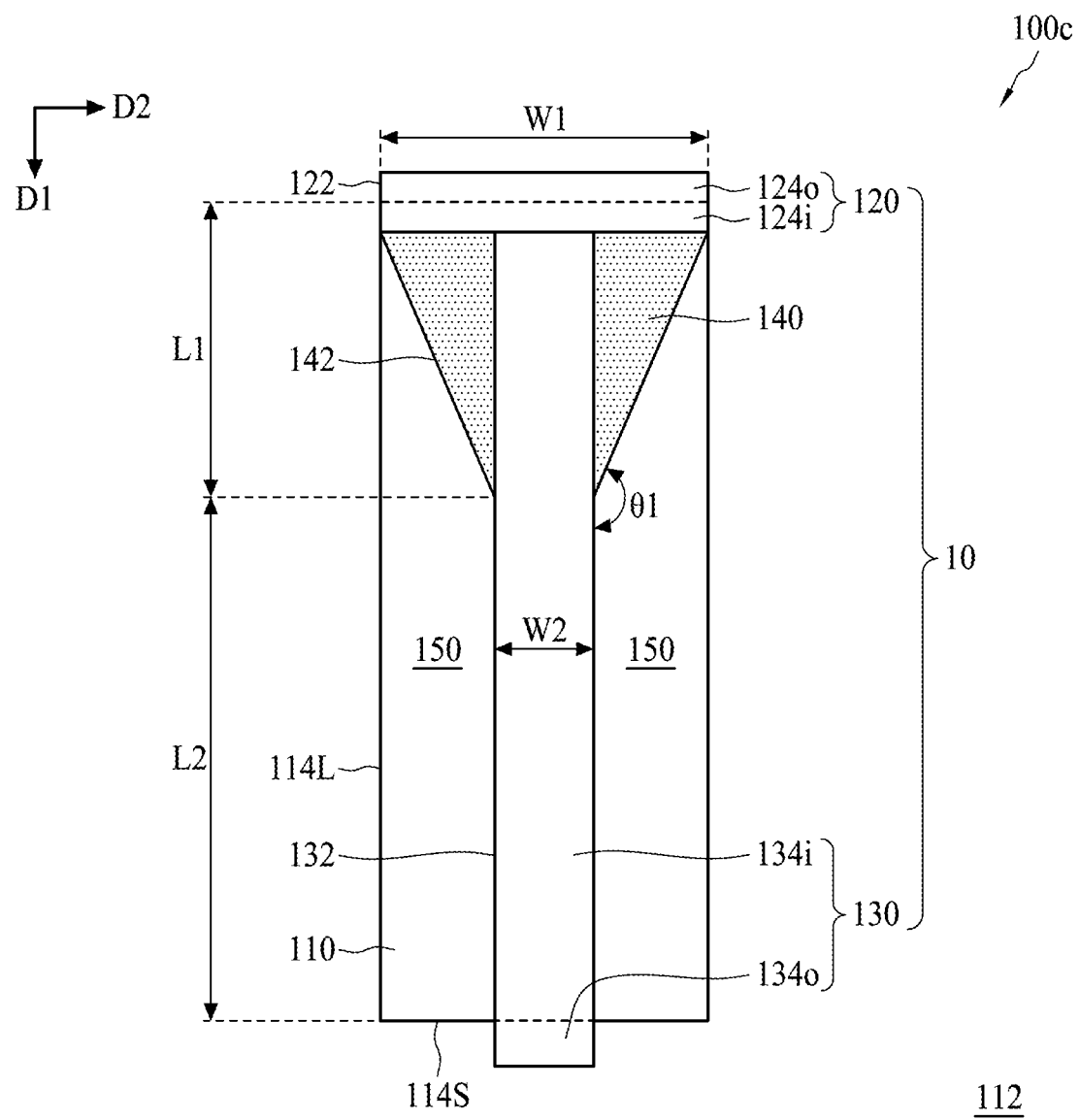
FIG. 1C is a schematic drawing illustrating a transistor device in accordance with some embodiments of the present disclosure.

FIGS. 1A, 1B and 1C are schematic drawings illustrating transistor devices 100a, 100b and 100c in accordance with some embodiments of the present disclosure. It should be noted that same elements in FIGS. 1A to 1C are designated by same numerals and can be formed by same processes. In some embodiments, a transistor device 100a, 100b or 100c is provided. The transistor devices 100a, 100b and 100c include a substrate (not shown). The substrate may include silicon (Si), silicon germanium (SiGe), gallium arsenide (GaAs), or other suitable semiconductor material. A well region (not shown) may be formed in the substrate. The well region may be neutral, or may be an n-type or p-type doped region, depending on the conductivity type of the transistor devices 100a, 100b and 100c. An active region 110 surrounded by an isolation structure 112 such as a shallow trench isolation (hereinafter abbreviated as STI) structure is formed in the substrate. In some embodiments, the isolation structure 112 defines location and size of the active region 110. In some embodiments, the active region 110 includes a rectangular shape, and the rectangular active region 110 includes a pair of long sides 114L and a pair of short sides 114S. In some embodiments, the long sides 114L extend in a first direction D1, and the short sides 114S extend in a second direction D2. In some embodiments, the first direction D1 is perpendicular to the second direction D2.

Referring to FIGS. 1A to 1C, a gate structure 10 is disposed over the active region 110 and the isolation structure 112. The gate structure 10 can be formed by the following steps. For example, a gate dielectric layer (not shown) is formed over the substrate and a gate conductive layer (not shown) is formed on the gate dielectric layer, but the disclosure is not limited thereto. In some embodiments, the gate dielectric layer can include dielectric material having high dielectric constant (high-k). For example, the gate dielectric layer can include silicon oxide (SiO), silicon nitride (SiN), silicon oxynitride (SiON), metal oxide such as hafnium oxide (HfO), or other suitable material chosen for compatibility, but the disclosure is not limited thereto. The gate conductive layer can include polysilicon or other suitable material such as metal materials with proper work function. Next, the gate conductive layer and the gate dielectric layer are patterned to form the gate structure 10 by performing a photolithography process and an etching process. In some embodiments, an optical proximity correction (OPC) can be performed before the etching process, but the disclosure is not limited to this. Further, the transistor devices 100a, 100b and 100c include a source/drain 150 disposed in the active region 110.

As shown in FIGS. 1A to 1C, the gate structure 10 includes a head portion 120, a body portion 130 and a pair of wing portions 140. The head portion 120 extends in the second direction D2, and the body portion extends in the first direction D1. As shown in FIGS. 1A to 1C, the head portion 120 is disposed at one end of the body portion 130, so that the head portion 120 and the body portion 130 form a T shape. The head portion 120 includes a width W1 measured in the second direction D2, and the body portion 130 includes a width W2 measure in the second direction D2. Further, the width W1 of the head portion 120 is greater than the width W2 of the body portion 130, but the disclosure is not limited thereto. The wing portions 140 are disposed at two opposite sides of the body portion 130. Further, each of the wing portions 140 is in contact with both of the head portion 120 and the body portion 130, as shown in FIGS. 1A to 1C.

It should be noted that the head portion 120 includes a first side 122, the body portion 130 includes a second side 132, and the first side 122 of the head portion 120 and the second side 132 of the body portion 130 both extend in the first direction D1. Each of the wing portions 140 includes a third side 142, and the third side 142 is in contact with both of the first side 122 of the head portion 120 and the second side 132 of the body portion 130. Further, the second side 132 of the body portion 130 and the third side 142 of the wing portion 140 form an included angle θ1, and the included angle θ1 is an obtuse angle. In some embodiments, the included angle θ1 is between 130° and 165°. The included angle θ1 is adjustable depending on different product requirements. For example, the included angle θ1 of the transistor device 100a is about 135°, the included angle θ1 of the transistor device 100b is about 150°, and the included angle θ1 of the transistor device 100c is about 165°, but the disclosure is not limited thereto. Further, since the third side 142 of the wing portion 140 is in contact with both of the first side 122 of the head portion 120 and the second side 132 of the body portion 130, a width of the wing portion 140 is between the width W1 of the head portion 120 and the width W2 of the body portion 130. In some embodiments, the greatest width of the wing portion 140 is equal to or less than the width W1 of the head portion 120 while the smallest width of the wing portion 140 is equal to the width W2 of the body portion 130.

Still referring to FIGS. 1A to 1C, the head portion 120 includes an inner portion 124i and an outer portion 124o. Specifically, the inner portion 124i of the head portion 120 overlaps the active region 110, and the outer portion 124o of the head portion 120 overlaps the isolation structure 112. The body portion 130 includes an inner portion 134i and an outer portion 134o. Specifically, the inner portion 134i of the body portion 130 overlaps the active region 110, and the outer portion 134o of the body portion 130 overlaps the isolation structure 112. In some embodiments, the head portion 120 overlaps the entire short side 114S while the body portion 130 overlaps a portion of the short side 114S, as shown in FIGS. 1A to 1C. In some embodiments, the head portion 120 can be formed to overlap a portion of the short side 114S and the body portion 130 can be formed to overlap a portion of the short side 114S. Further, the inner portion 124i of the head portion 120 over the active region 110 and the wing portion 140 include a first length L1, and the inner portion 134i of the body portion 130 includes a second length L2. As shown in FIGS. 1A to 1C, the first length L1 and the second length L2 extend in the first direction D1. The second length L2 is greater than the first length L1. In some embodiments, a ratio of the first length L1 to the second length L2 is between 1:3 and 1:12, but the disclosure is not limited thereto. Additionally, the third sides 142 of the wing portions 140 and the second side 132 of the body portion 130 are in contact with an edge of the source/drain 150, as shown in FIGS. 1A to 1C.

In accordance with the transistor devices 100a, 100b and 100c provided by the some embodiments of the present disclosure, an asymmetrical channel region is formed. The asymmetrical channel region can include a channel width equal to a sum of the first length L1 and the second length L2. The asymmetrical channel region can include multiple channel lengths. For example, the asymmetrical channel region can include a first channel length equal to the width W1 of the head portion 120, a second channel length equal to the width W2 of the body portion 130, and various third channel lengths equal to the width of the wing portion 140, which are between the first width W1 and the second width W2 as mentioned above.

In the transistor devices 100a, 100b and 100c provided by the present disclosure, the included angle θ1 formed by the third side 142 of the wing portion 140 and the second side 132 of the body portion 130 creates rounded edges. Accordingly, the electric field crowding issue is mitigated by the rounded edges. As a result, leakage current and power consumption are both reduced. Further, since the wing portions 140 of the gate structure 10 include slanted sides (i.e., the third sides 142) with respect to the source/drain 150, driving current in increased, and thus performance of the transistor devices 100a, 100b and 100c is improved.

Figure 2A:
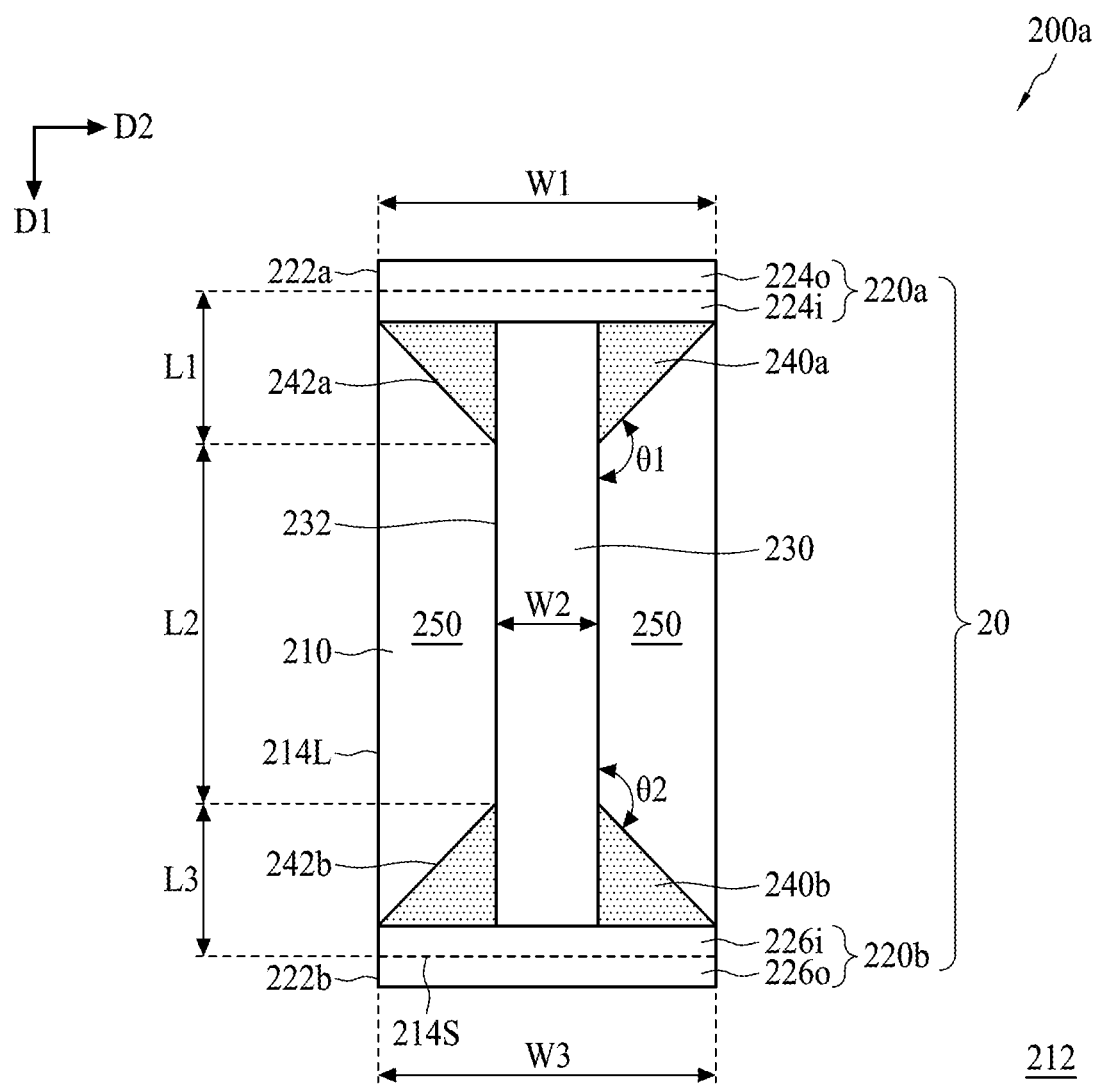
FIG. 2A is a schematic drawing illustrating a transistor device in accordance with some embodiments of the present disclosure.
Figure 2B:
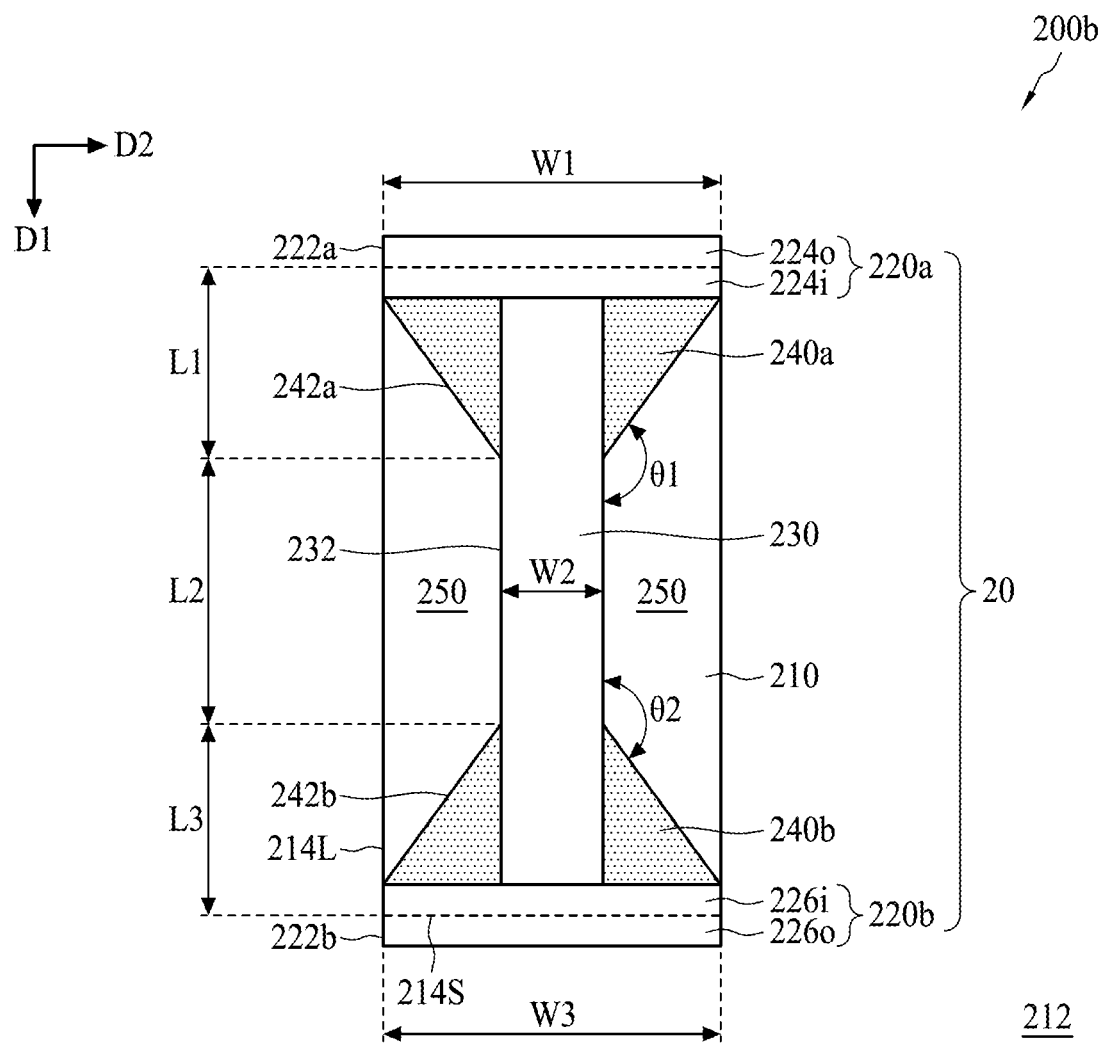
FIG. 2B is a schematic drawing illustrating a transistor device in accordance with some embodiments of the present disclosure.
Figure 2C:
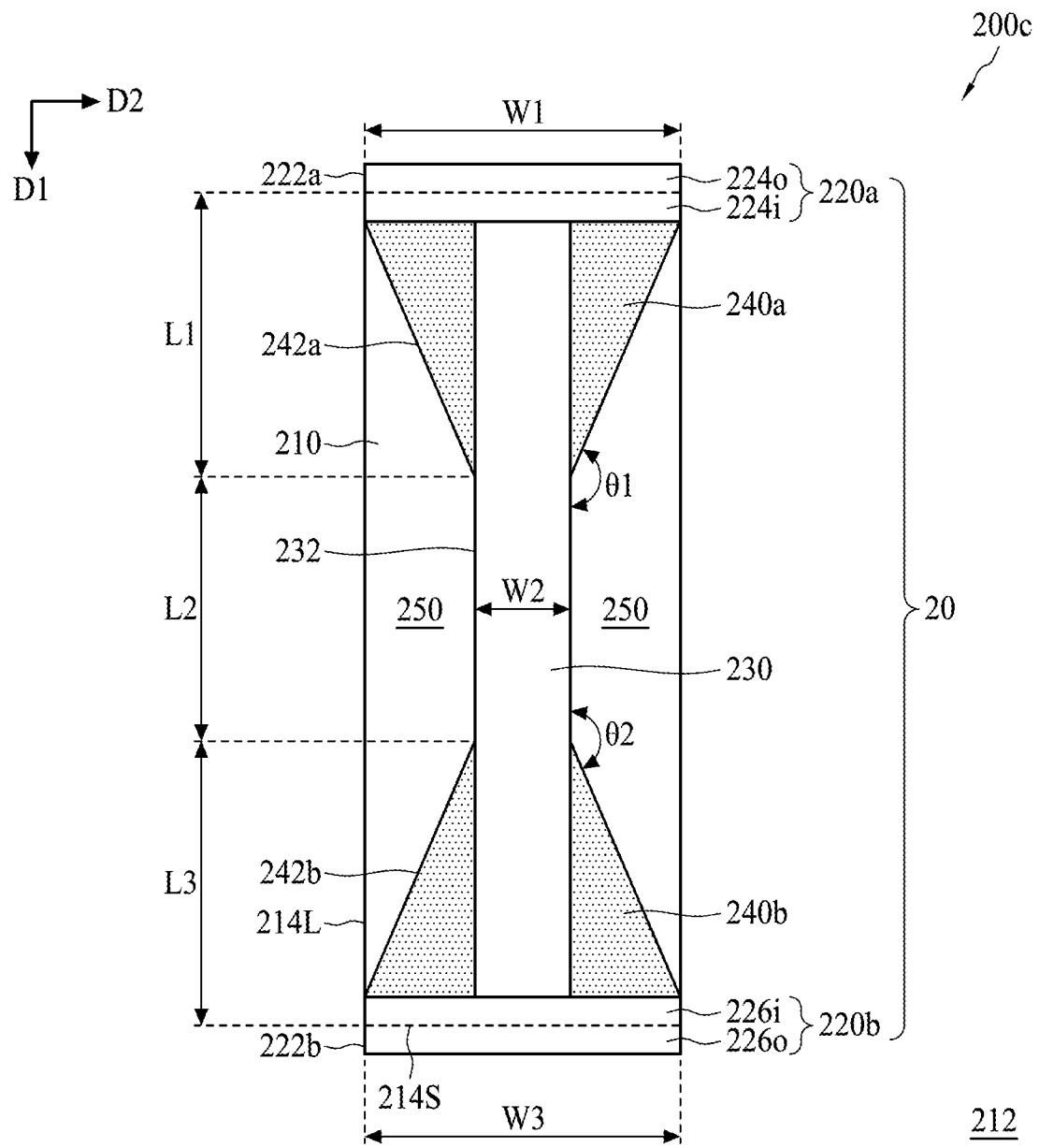
FIG. 2C is a schematic drawing illustrating a transistor device in accordance with some embodiments of the present disclosure.

FIGS. 2A, 2B and 2C are schematic drawings illustrating transistor devices 200a, 200b and 200c in accordance with some embodiments of the present disclosure. It should be noted that same elements in FIGS. 2A to 2C are designated by same numerals and can be formed by same processes. Further, same elements in FIGS. 1A to 1C and FIGS. 2A to 2C can include same materials, so such details are omitted in the interest of brevity. In some embodiments, transistor devices 200a, 200b or 200c are provided. The transistor devices 200a, 200b and 200c include a substrate (not shown). A well region (not shown) may be formed in the substrate. The well region may be neutral, or may be an n-type or p-type doped region, depending on the conductivity type of the transistor devices 200a, 200b and 200c. An active region 210 surrounded by an isolation structure 212 such as an STI structure is formed in the substrate. In some embodiments, the isolation structure 212 defines location and size of the active region 210. In some embodiments, the active region 210 includes a rectangular shape, and the rectangular active region 210 includes a pair of long sides 214L and a pair of short sides 214S. In some embodiments, the long sides 214L extend in a first direction D1, and the short sides 214S extend in a second direction D2. In some embodiments, the first direction D1 is perpendicular to the second direction D2. Further, the transistor devices 200a, 200b and 200c include a gate structure 20 disposed over the active region 210 and the isolation structure 212, and a source/drain 250 disposed in the active region 210.

As shown in FIGS. 2A to 2C, the gate structure 20 includes a first head portion 220a, a second head portion 220b, a body portion 230, a pair of first wing portions 240a, and a pair of second wing portions 240b. The first head portion 220a and the second head portion 220b extend in the second direction D2 while the body portion 230 extends in the first direction D1. As shown in FIGS. 2A to 2C, the first head portion 220a and the second head portion 220b are disposed at two opposite ends of the body portion 230. In other words, the first head portion 220a and the second head portion 220b are spaced apart from each other by the body portion 230. Accordingly, the first head portion 220a, the second head portion 220b and the body portion 230 form an H shape. The first head portion 220a includes a width W1 measured in the second direction D2, the body portion 230 includes a width W2 measure in the second direction D2, and the second head portion 220b includes a width W3 measured in the second direction D2. Further, the width W1 of the first head portion 220a is greater than the width W2 of the body portion 230, and the width W3 of the second head portion 220b is greater than the width W2 of the body portion 230, but the disclosure is not limited thereto. In some embodiments, the width W1 of the first head portion 220a is equal to the width W3 of the second head portion 220b, but the disclosure is not limited thereto. The first wing portions 240a are disposed at two opposite sides of the body portion 230, and the second wing portions 240b are disposed at two opposite sides of the body portion 230. Further, each of the first wing portions 240a is in contact with both of the first head portion 220a and the body portion 230 while each of the second wing portions 240b is in contact with both of the second head portion 220b and the body portion 230, as shown in FIGS. 2A to 2C. Accordingly, the first wing portions 240a and the second wing portions 240b are spaced apart from each other by the body portion 230.

It should be noted that the first head portion 220a includes a first side 222a, the body portion 230 includes second side 232, and the second head portion 220b includes a third side 222b. The first side 222a of the first head portion 220a, and the second side 232 of the body portion 230 and the third side 222b of the second head portion 220b all extend in the first direction D1. Each of the first wing portions 240a includes a fourth side 242a, and the fourth side 242a is in contact with both of the first side 222a of the first head portion 220a and the second side 232 of the body portion 230. Each of the second wing portions 240b includes a fifth side 242b, and the fifth side 242b is in contact with both of the third side 222b of the second head portion 220b and the second side 232 of the body portion 230. Further, the second side 232 of the body portion 230 and the fourth side 242a of the first wing portion 240a form a first included angle θ1, and the second side 232 of the body portion 230 and the fifth side 242b of the second wing portion 240b form a second included angle θ2. The first included angle θ1 and the second included angle θ2 are obtuse angles. In some embodiments, the first included angle θ1 and the second included angle θ2 are between 130° and 165°. The first included angle θ1 and the second included angle θ2 are adjustable depending on different product requirements. For example, the first included angle θ1 and the second included angle θ2 of the transistor device 200a are about 135°, the first included angle θ1 and the second included angle θ2 of the transistor device 200b are about 150°, and the first included angle θ1 and the second included angle θ2 of the transistor device 200c are about 165°, but the disclosure is not limited thereto. In some embodiments, the first included angle θ1 is equal to the second included angle θ2. However in other embodiments, the first included angle θ1 can be different from the second included angle θ2. Further, since the fourth side 242a of the first wing portion 240a is in contact with both of the first side 222a of the first head portion 220a and the second side 232 of the body portion 230, a width of the first wing portion 240a is between the width W1 of the first head portion 220a and the width W2 of the body portion 230. Similarly, since the fifth side 242b of the second wing portion 240b is in contact with both of the third side 222b of the second head portion 220b and the second side 232 of the body portion 230, a width of the second wing portion 240b is between the width W3 of the second head portion 220b and the width W2 of the body portion 230. In some embodiments, the greatest width of the first wing portion 240a is equal to or less than the width W1 of the first head portion 220a while the smallest width of the first wing portion 240a is equal to the width W2 of the body portion 230. In some embodiments, the greatest width of the second wing portion 240b is equal to or less than the width W3 of the second head portion 220b while the smallest width of the second wing portion 240b is equal to the width W2 of the body portion 230.

Still referring to FIGS. 2A to 2C, the first head portion 220a includes an inner portion 224i and an outer portion 224*o*. Specifically, the inner portion 224*i* of the first head portion 220*a* overlaps the active region 210, and the outer portion 224*o* of the first head portion 220*a* overlaps the isolation structure 212. The second head portion 220*b* includes an inner portion 226*i* and an outer portion 226*o*. The inner portion 226*i* of the second head portion 220*b* overlaps the active region 210, and the outer portion 226*o* of the second head portion 226*o* overlaps the isolation structure 212. In some embodiments, the first head portion 220*a* and the second head portion 220*b* overlap the entire short side 214S while the entire body portion 230 is disposed within the active region 210, as shown in FIGS. 2A to 2C. In some embodiments, the inner portion 224*i* of the first head portion 220*a* over the active region 210 and the first wing portion 240*a* include a first length L1, the body portion 230 includes a second length L2, and the inner portion 226*i* of the second head portion 220*b* included a third length L3. As shown in FIGS. 2A to 2C, the first length L1, the second length L2 and third length L3 extend in the first direction D1. The second length L2 is greater than the first length L1 and the third length L3. In some embodiments, a ratio of the first length L1, the second length L2 and the third length L3 is between 1:3:1 and 1:12:1, but the disclosure is not limited thereto. Additionally, the fourth sides 242*a* of the first wing portions 240*a*, the second side 232 of the body portion 230, and the fifth sides 242*b* of the second wing portions 240*b* are in contact with an edge of the source/drain 250, as shown in FIGS. 2A to 2C.

In accordance with the transistor devices 200*a*, 200*b* and 200*c* provided by the some embodiments of the present disclosure, a symmetrical channel region is formed. The symmetrical channel region can include a channel width equal to a sum of the first length L1, the second length L2 and the third length L3. The symmetrical channel region can include multiple channel lengths. For example, the symmetrical channel region can include a first channel length equal to the width W1 of the first head portion 220*a*, a second channel length equal to the width W2 of the body portion 230, a third channel length equal to the width W3 of the second head portion 220*b*, various fourth channel lengths equal to the widths of the first wing portions 240*a*, and various fifth channel lengths equal to the widths of the second wing portions 240*b*. As mentioned above, the width of the first wing portions 240*a* is between the width W1 and the width W2, and the width of the second wing portions 240*b* is between the width W2 and the width W3.

In the transistor devices 200*a*, 200*b* and 200*c* provided by the present disclosure, the first included angle θ1 formed by the fourth side 242*a* of the first wing portion 240*a* and the second side 232 of the body portion 230 creates rounded edges. Similarly, the second included angle θ2 formed by the fifth side 242*b* of the second wing portion 240*b* and the second side 232 of the body portion 230 creates rounded edges. Accordingly, the electric field crowding issue is mitigated by the rounded edges. As a result, leakage current and power consumption are both reduced. Further, since the first wing portions 240*a* and the second wing portions 240*b* of the gate structure 20 include slanted sides (i.e., the fourth sides 242*a* and the fifth sides 242*b*) with respect to the source/drain 250, driving current is increased, and thus performance of the transistor devices 100*a*, 100*b* and 100*c* is improved.

In the present disclosure, the transistor devices 100*a* to 100*c* and 200*a* to 200*c* are provided. In some embodiments, the transistor devices 100*a* to 100*c* include a T-gate structure 10 with the wing portions 140 contacting both of the head portion 120 and the body portion 130. In some embodiments, the transistor devices 200*a* to 200*c* include an H-gate structure 20 with the first wing portions 240*a* and the second wing portions 240*b*. As mentioned above, the first wing portions 240*a* contact the first head portion 220*a* and the body portion 230, and the second wing portions 240*b* contact the second head portion 220*b* and the body portion 230. Further, the wing portions 140, 240*a* and 240*b* and the body portion 130 and 230 form obtuse angles. Consequently, rounded edges are formed due to the obtuse angle formed by the body portion 130 and 230 and the wing portions 140, 240*a* and 240*b*, and thus the electric field crowding issue is mitigated by the rounded edges. As a result, leakage current and power consumption are both reduced. Further, since the gate structures 10 and 20 include the wing portions 140, 240*a* and 240*b*, which include a slanted side with respect to the source/drain 150 and 250, driving current is increased, and thus performance of the transistor devices 100*a* to 100*c* and 200*a* to 200*c* is improved.

In contrast, with a comparative transistor device or semiconductor layout structure including a T-gate structure or an H-gate structure, electric fields are always concentrated or crowded at the right angle between the body portion and the head portion, and thus leakage current cannot be reduced. The comparative transistor device or semiconductor layout structure therefore suffers from higher power consumption.

One aspect of the present disclosure provides a transistor device. The transistor device includes an active region surrounded by an isolation structure, a gate structure disposed over the active region and the isolation structure, and a source/drain disposed in the active region. The gate structure includes a body portion extending in a first direction, a head portion extending in a second direction, and a pair of wing portions disposed at two opposite sides of the body portion. The first direction and the second direction are perpendicular to each other. Each of the wing portions is in contact with the head portion and the body portion.

One aspect of the present disclosure provides a transistor device. The transistor device includes an active region surrounded by an isolation structure, a gate structure disposed over the active region and the isolation structure, and a source/drain disposed in the active region. The gate structure includes a body portion extending in a first direction, a first head portion and a second head portion extending in a second direction, a pair of first wing portions disposed at two opposite sides of the body portion, and a pair of second wing portions disposed at two opposite sides of the body portion. The first direction and the second direction are perpendicular to each other. The first head portion and the second head portion are disposed at two opposite ends of the body portion. The first wing portions are in contact with the first head portion and the body portion. The second portions are in contact with the second head portion and the body portion.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A transistor device comprising:
    an active region surrounded by an isolation structure;
    a gate structure disposed over the active region and the isolation structure, the gate structure comprising:
        a body portion extending in a first direction;
        a first head portion and a second head portion extending in a second direction perpendicular to the first direction, wherein the first head portion and the second head portion are disposed at two opposite ends of the body portion;
        a pair of first wing portions disposed at two opposite sides of the body portion, wherein each of the first wing portions is in contact with the first head portion and the body portion; and
        a pair of second wing portions disposed at two opposite sides of the body portion, wherein each of the second wing portions is in contact with the second head portion and the body portion; and
    a source/drain disposed in the active region,
    wherein a maximum length of the source/drain extending in the first direction substantially corresponds to a shortest distance between the first head portion and the second head portion.

2. The transistor device of claim 1, wherein the first head portion comprises a first side extending in the first direction, the body portion comprises a second side extending in the first direction, and the second head portion comprises a third side extending in the first direction.

3. The transistor device of claim 2, wherein each of the first wing portions comprises a fourth side in contact with the first side of the first head portion and the second side of the body portion, and each of the second wing portions comprises a fifth side in contact with the third side of the second head portion and the second side of the body portion.

4. The transistor device of claim 3, wherein the second side of the body portion and the fourth side of each of the first wing portions form a first included angle, the second side of the body portion and the fifth side of each of the second wing portions form a second included angle, and the first included angle and the second included angle are obtuse angles.

5. The transistor device of claim 3, wherein the second side of the body portion, the fourth sides of the first wing portions and the fifth sides of the second wing portions are in contact with an edge of the source/drain.

6. The transistor device of claim 4, wherein the first included angle and the second included angle are between 130° and 165°, respectively.

7. The transistor device of claim 2, wherein a portion of the first head portion over the active region and the first wing portion comprise a first length, the body portion comprises a second length, and a portion of the second head portion over the active region and the second wing portion comprise a third length.

8. The transistor device of claim 7, wherein a ratio of the first length, the second length and the third length is between 1:3:1 and 1:12:1.

9. The transistor device of claim 1, wherein a portion of the first head portion and a portion of the second head portion each overlaps a portion of the isolation structure.

10. The transistor device of claim 1, wherein the first wing portions are spaced apart from the second wing portions.

11. The transistor device of claim 1, wherein a width of the first head portion and a width of the second head portion are greater than a width of the body portion.

12. The transistor device of claim 1, wherein each of a width of the first head portion and a width of the second head portion substantially corresponds to a width of the body portion and a width of the source/drain combined.

13. The transistor device of claim 1, wherein a width of the first head portion substantially corresponds to a width of the body portion and a width of a side of each of the first wing portions contacting the first head portion combined.

14. The transistor device of claim 1, wherein a width of the second head portion substantially corresponds to a width of the body portion and a width of a side of each of the second wing portions contacting the second head portion combined.

15. A transistor device comprising:
    an active region surrounded by an isolation structure;
    a gate structure disposed over the active region and the isolation structure, the gate structure comprising:
        a body portion extending in a first direction;
        a first head portion and a second head portion extending in a second direction perpendicular to the first direction, wherein the first head portion and the second head portion are disposed at two opposite ends of the body portion;
        a pair of first wing portions disposed at two opposite sides of the body portion, wherein each of the first wing portions is in contact with the first head portion and the body portion and has a first side extending in the second direction and contacting the first head portion; and
        a pair of second wing portions disposed at two opposite sides of the body portion, wherein each of the second wing portions is in contact with the second head portion and the body portion and has a second side extending in the second direction and contacting the second head portion; and
    a source/drain disposed in the active region and having a length extending in the first direction,
    wherein a maximum length of the source extending in the first direction substantially corresponds to a distance between the first side of the first wiring portions and the second side of the second wiring portions.

* * * * *